(12) United States Patent
Kader et al.

(10) Patent No.: US 12,542,419 B2
(45) Date of Patent: Feb. 3, 2026

(54) MODE-HOP FREE LASER MODULE

(71) Applicant: DENSELIGHT SEMICONDUCTORS PTE LTD, Singapore (SG)

(72) Inventors: Kamal Kader, Singapore (SG); Long Cheng Koh, Singapore (SG); Andy Piper, Singapore (SG); Yee Loy Lam, Singapore (SG)

(73) Assignee: DENSELIGHT SEMICONDUCTORS PTE LTD, Singapore (SG)

( * ) Notice: Subject to any disclaimer, the term of this patent is extended or adjusted under 35 U.S.C. 154(b) by 987 days.

(21) Appl. No.: 17/656,323

(22) Filed: Mar. 24, 2022

(65) Prior Publication Data

US 2022/0329045 A1 Oct. 13, 2022

Related U.S. Application Data

(60) Provisional application No. 63/165,437, filed on Mar. 24, 2021.

(51) Int. Cl.
*H01S 3/098* (2006.01)
*H01S 3/08* (2023.01)
(Continued)

(52) U.S. Cl.
CPC ........ *H01S 5/0612* (2013.01); *H01S 3/08013* (2013.01); *H01S 5/02415* (2013.01);
(Continued)

(58) Field of Classification Search
CPC ............... H01S 5/0612; H01S 3/08013; H01S 5/02415; H01S 5/02438; H01S 5/02469;
(Continued)

(56) References Cited

U.S. PATENT DOCUMENTS 4,860,305 A * 8/1989 Miyauchi .................. H01S 5/14
372/98
4,864,585 A * 9/1989 Hayashi .................. H01S 5/142
372/99

(Continued)

FOREIGN PATENT DOCUMENTS

| JP | H06350565 A | 12/1994 |
| JP | 2004327791 A | 11/2004 |
| JP | 2010177328 A | 8/2010 |

OTHER PUBLICATIONS

International Search Report and Written Opinion in PCT/IB2022/052648 dated Jun. 21, 2022.

*Primary Examiner* — Kinam Park
(74) *Attorney, Agent, or Firm* — CHIP Law Group

(57) ABSTRACT

A laser module includes a gain chip, temperature sensors, a case, and a thermoelectric cooler (TEC). The gain chip emits a laser beam. One of the temperature sensors measures a first temperature of the gain chip and is encompassed by the gain chip. The other temperature sensor is adhered to the case and measures a second temperature. The TEC tunes the laser beam emitted by the gain chip to a desired wavelength by varying the first temperature of the gain chip through a set of third temperatures for various values of the second temperature. The set of third temperatures is selected from various values of the first temperature such that the laser beam emitted at the set of third temperatures is mode-hop free.

14 Claims, 10 Drawing Sheets

(51) Int. Cl.
*H01S 5/024* (2006.01)
*H01S 5/028* (2006.01)
*H01S 5/06* (2006.01)
*H01S 5/065* (2006.01)
*H01S 5/068* (2006.01)
*H01S 5/14* (2006.01)
*H01S 5/02218* (2021.01)
*H01S 5/023* (2021.01)

(52) U.S. Cl.
CPC ...... *H01S 5/02438* (2013.01); *H01S 5/02469* (2013.01); *H01S 5/028* (2013.01); *H01S 5/0617* (2013.01); *H01S 5/0657* (2013.01); *H01S 5/06804* (2013.01); *H01S 5/141* (2013.01); *H01S 5/02218* (2021.01); *H01S 5/023* (2021.01); *H01S 2301/16* (2013.01)

(58) Field of Classification Search
CPC ...... H01S 5/028; H01S 5/0617; H01S 5/0657; H01S 5/06804; H01S 5/141; H01S 5/02218; H01S 5/023; H01S 2301/16; H01S 5/02208; H01S 5/02325; H01S 5/02476; H01S 5/147
See application file for complete search history.

(56) References Cited

U.S. PATENT DOCUMENTS

| | | | |
|---|---|---|---|
| 2007/0127538 A1* | 6/2007 | Lee | G02B 6/0219 372/99 |
| 2011/0002349 A1 | 1/2011 | Mizutani et al. | |
| 2012/0099611 A1* | 4/2012 | Kim | H01S 5/141 372/20 |
| 2014/0072004 A1* | 3/2014 | Connolly | H01S 3/0405 372/34 |
| 2014/0376579 A1* | 12/2014 | Wach | H01S 5/0683 372/34 |
| 2016/0006211 A1* | 1/2016 | Kim | H01S 5/141 372/20 |
| 2016/0020575 A1* | 1/2016 | Choi | H04B 10/00 372/20 |
| 2016/0261089 A1* | 9/2016 | Felder | H01S 5/14 |
| 2016/0301187 A1 | 10/2016 | Weida et al. | |

* cited by examiner

MODE-HOP FREE LASER MODULE

CROSS-REFERENCE TO RELATED APPLICATIONS/INCORPORATION BY REFERENCE

This patent application makes reference to, claims priority to, and claims the benefit of U.S. provisional application 63/165,437 filed Mar. 24, 2021, the contents of which is hereby incorporated herein by reference in its entirety.

FIELD OF THE DISCLOSURE

Various embodiments of the disclosure relate generally to optoelectronic systems. More particularly, various embodiments of the present disclosure relate to a mode-hop free laser module.

BACKGROUND

Laser sources with narrow lasing line width are widely used as an enabling component for sensing applications. Laser modules with narrow lasing linewidth conventionally utilize an external cavity design to achieve narrow linewidth characteristics. A standard design of a conventional laser module includes a gain chip that emits a laser beam, and is coupled to a grating element having a narrowband reflection spectrum. In such a configuration, the grating element acts as a wavelength discriminator that re-circulates a narrow band of spontaneous emission back into the gain chip. Each pass of the reflection spectrum through the gain chip further amplifies and refines the laser beam, thus obtaining a narrow linewidth output. By modeling the gain chip as a standalone resonator, a set of longitudinal cavity modes are formed inside the gain chip. As the reflection spectrum interacts with the gain chip, the reflection spectrum is locked onto one of the longitudinal cavity modes having a wavelength nearer to a wavelength of the reflection spectrum.

A wavelength of the laser beam may be fine-tuned by shifting the temperature of the gain chip. As the temperature of the gain chip varies, the longitudinal cavity modes drift due to changes in a length of the gain chip and a refractive index of the grating element. When the longitudinal cavity modes drift, the reflection spectrum is locked to another longitudinal cavity mode that is adjacent to the previously locked longitudinal cavity mode thereby resulting in mode-hopping. In addition, the wavelength of the reflection spectrum jumps to a wavelength of the newly locked longitudinal cavity mode which results in a shift of the wavelength of the laser beam. The shift of the wavelength results in mode-hopping. Mode-hopping is undesirable as it may cause false trigger signals when the laser sources are used for various applications. The problem of mode-hopping typically occurs in grating mirrors, volume Bragg grating, and fiber Bragg grating-based external cavity lasers (ECLs).

Conventional laser modules offer a mode-hop free window, during which the wavelength of the laser beam can be tuned in a range of 0-0.03 nanometers. However, such a narrow wavelength tuning range is not sufficient to tune the wavelength of the laser beam to a desired wavelength.

Limitations and disadvantages of conventional approaches will become apparent to one of skill in the art, through comparison of described systems with some aspects of the present disclosure, as outlined in the remainder of the present application and with reference to the drawings.

SUMMARY

A laser module is provided substantially as shown in, and/or described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

The accompanying drawings illustrate various embodiments of systems, methods, and other aspects of the disclosure. It will be apparent to a person skilled in the art that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another, and vice versa.

Various embodiments of the present disclosure are illustrated by way of example, and not limited by the appended figures, in which like references indicate similar elements, and in which.

Figure 1:
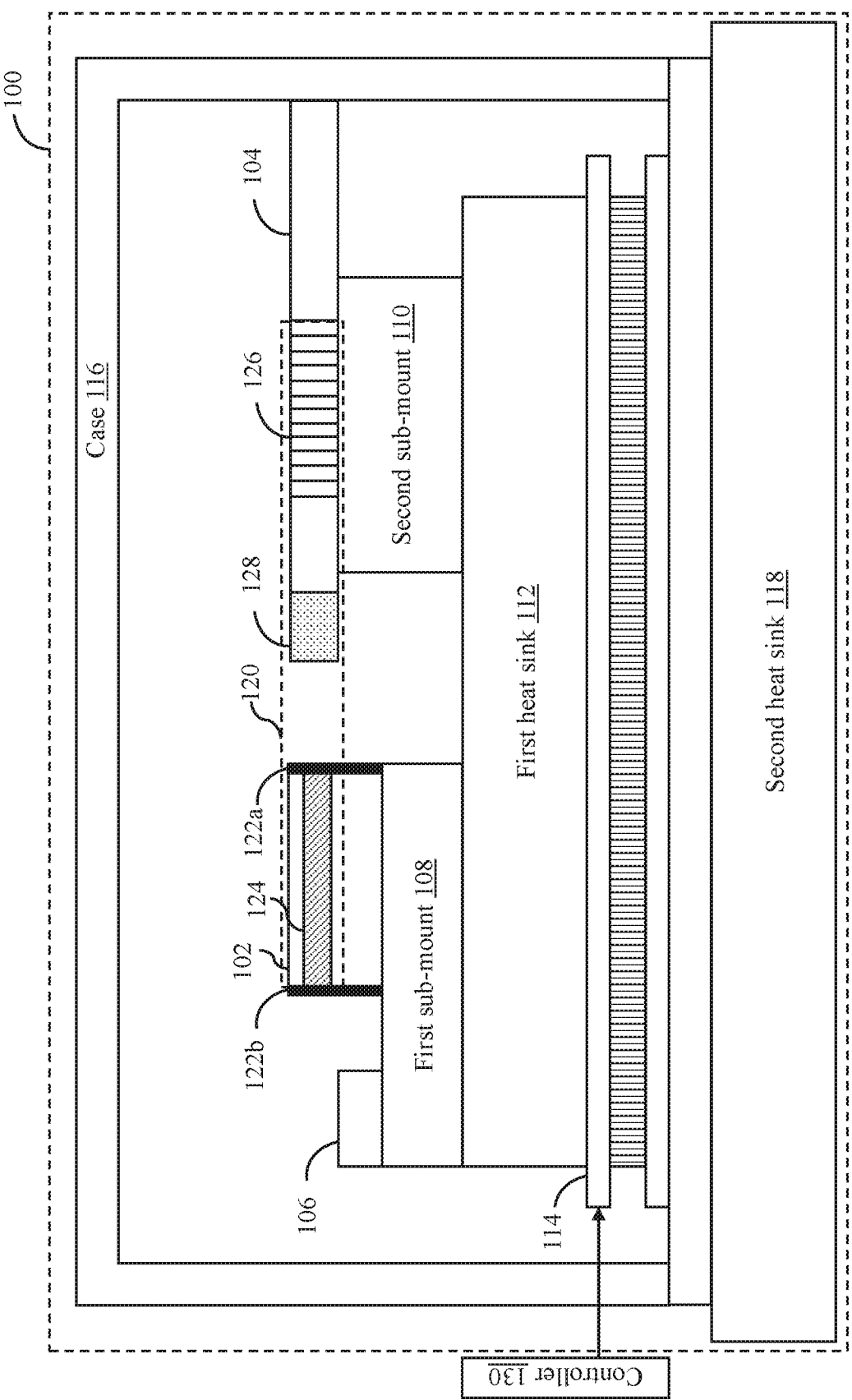
FIG. 1 is a diagram that illustrates a conventional laser module.

Further areas of applicability of the present disclosure will become apparent from the detailed description provided hereinafter. It should be understood that the detailed description of exemplary embodiments is intended for illustration purposes only and is, therefore, not intended to necessarily limit the scope of the present disclosure.

DETAILED DESCRIPTION

The present disclosure is best understood with reference to the detailed figures and description set forth herein.

Various embodiments are discussed below with reference to the figures. However, those skilled in the art will readily appreciate that the detailed description given herein with respect to the figures are simply for explanatory purposes as the methods and systems may extend beyond the described embodiments. In one example, the teachings presented and the needs of a particular application may yield multiple alternate and suitable approaches to implement the functionality of any detail described herein. Therefore, any approach may extend beyond the particular implementation choices in the following embodiments that are described and shown.

References to "an embodiment", "another embodiment", "yet another embodiment", "one example", "another example", "yet another example", "for example" and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

In an embodiment, a laser module may be provided. The laser module comprises a gain chip, a first temperature sensor, a case, a second temperature sensor, and a first thermoelectric cooler (TEC). The gain chip may be configured to emit a laser beam. The first temperature sensor may be coupled to the gain chip. The first temperature sensor may be configured to measure a first temperature of the gain chip. The case may encompass the gain chip and the first temperature sensor. The second temperature sensor may be adhered to the case. The second temperature sensor may be configured to measure a second temperature of the case. The first TEC may be coupled to the first temperature sensor and the second temperature sensor. The first TEC may be configured to tune a plurality of wavelengths of the laser beam emitted from the gain chip at a first set of values of the second temperature to select a second set of values of the first temperature from a third plurality of values of the first temperature. The second set of values of the first temperature is selected such that when the gain chip emits the laser beam, the plurality of wavelengths of the laser beam emitted at the second set of values of the first temperature are mode-hop free.

In some embodiments, the second set of values of the first temperature may include a first value, the first set of values of the second temperature may include a second value, and the third plurality of values of the first temperature may include a third value and a fourth value. The first value for tuning the laser beam to a first wavelength of the plurality of wavelengths at the second value may be selected such that the first value may be a mean of the third value and the fourth value. The first wavelength may be mode-hop free between the third value and the fourth value.

In some embodiments, the laser module may be placed on an external TEC, such that a temperature of the laser module is controlled by the external TEC and a controller that is external to the laser module. The first set of values of the second temperature is based on the temperature of the laser module.

In some embodiments, the laser module may be placed in a thermal chamber such that a temperature of the laser module is controlled by the thermal chamber and a controller that is external to the laser module. The first set of values of the second temperature is based on the temperature of the laser module.

In some embodiments, the tuning of the plurality of wavelengths of the laser beam emitted from the gain chip may be controlled by a controller that is external to the laser module.

In some embodiments, the laser module is an external cavity laser module.

In some embodiments, the second temperature sensor may be adhered to the case using one of a thermally conductive adhesive and a thermally conductive epoxy.

In some embodiments, the second temperature sensor may be adhered to one of an interior surface of the case and an exterior surface of the case.

In some embodiments, a wavelength tuning range of the gain chip may be in a range of 0.03-0.5 nanometers.

In some embodiments, the laser module further comprises a first submount and a first heatsink. The gain chip may be mounted on the first submount. The first submount is formed of a thermally conductive material. The first heatsink may be mounted on the first TEC, and the first submount may be mounted on the first heatsink. The first heatsink may be configured to transfer heat between the first submount and the first TEC.

In some embodiments, the laser module further comprises a grating element and a second submount. The grating element may be optically coupled to the gain chip. The grating element may be configured to receive the laser beam from the gain chip. The grating element may further comprise a diffraction grating that reflects first wavelengths of the plurality of wavelengths of the laser beam into the gain chip and transmits second wavelengths of the plurality of wavelengths of the laser beam to emit an output beam from the laser module. The second submount may be mounted on the first heatsink, and the grating element may be mounted on the second submount. The second submount may thermally isolate the grating element from the first heatsink.

In some embodiments, a first end of the grating element may be a lensed fiber for coupling the laser beam emitted from the gain chip into the grating element.

In some embodiments, the output beam emitted from the laser module has a single wavelength mode.

In some embodiments, the laser module further comprises an external cavity formed between the gain chip and the diffraction grating. The external cavity facilitates optical coupling of the gain chip to the grating element.

In some embodiments, the case may further encompass the first TEC, the first heatsink, the first submount, the second submount, the grating element, and the external cavity.

In some embodiments, the laser module further comprises a second heatsink. The case is mounted on the second heatsink.

In some embodiments, the laser module further comprises a second TEC sandwiched between the case and the second heatsink. The second TEC may facilitate a wavelength tuning of the gain chip. The second TEC is controlled by a controller that is external to the laser module for facilitating the wavelength tuning of the gain chip.

In some embodiments, the gain chip has a front-end and a back-end. The front-end may be coated with an anti-reflective material and the back-end may be coated with a reflective material.

In some embodiments, the laser module further comprises a thermal resistance material. The thermal resistance material may encompass the case, the second TEC, and the second heatsink to prevent thermal leakage from the laser module to an ambient environment.

In another embodiment, a method of tuning wavelengths of a laser module is provided. The method comprises emitting a laser beam by a gain chip of the laser module. The method further comprises measuring a first temperature of the gain chip by a first temperature sensor of the laser module. The method further comprises measuring a second temperature by a second temperature sensor adhered to a case. The case encompasses the gain chip and the first temperature sensor. The method further comprises tuning a plurality of wavelengths of the laser beam emitted from the gain chip by a thermoelectric cooler of the laser module, at a first set of values of the second temperature to select a second set of values of the first temperature from a third plurality of values of the first temperature. The second set of values of the first temperature is selected such that when the gain chip emits the laser beam, the plurality of wavelengths of the laser beam emitted at the second set of values of the first temperature are mode-hop free.

Various embodiments of the present disclosure disclose a laser module. The laser module includes a gain chip, a grating element, temperature sensors, a case, and a thermoelectric cooler (TEC). The gain chip emits a laser beam at various wavelengths. The grating element receives the laser beam and reflects few wavelengths of the laser beam back into the gain chip and allows other wavelengths to pass through the grating element that form an output beam of the laser module. One of the temperature sensors measures a temperature of the gain chip, and is encompassed by the case. The case further encompasses the gain chip and the grating element. The other temperature sensor is adhered to the case and measures a temperature of the case. The TEC tunes a wavelength of the laser beam at a set of values of the second temperature to select a set of values of the first temperature. When the wavelength of the laser beam is tuned at the set of values of the first temperature, the laser beam emitted from the gain chip is mode-hop free. Thus, the laser module provides a wider wavelength tuning range with emission of mode-hop free wavelengths of the laser beam in comparison to conventional laser modules.

FIG. 1 is a diagram that illustrates a conventional laser module 100. The conventional laser module 100 includes a first gain chip 102, a first grating element 104, a first temperature sensor 106, a first submount 108, a second submount 110, a first heatsink 112, a first thermoelectric cooler (TEC) 114, a first case 116, a second heatsink 118, and a first external cavity 120. The first gain chip 102 is mounted on the first submount 108. The first gain chip 102 includes a first gain medium 124 through which the first gain chip 102 emits a first laser beam. The first laser beam is emitted at a first plurality of wavelengths.

The first grating element 104 is mounted on the second submount 110 and is optically coupled to the first gain chip 102. The first grating element 104 includes a diffraction grating 126. Further, one end of the first grating element 104 is a lensed fiber 128. The lensed fiber 128 facilitates an optical coupling of the first gain chip 102 to the first grating element 104. The first grating element 104 receives the first laser beam emitted by the first gain chip 102. The first grating element 104 acts as a wavelength discriminator as the diffraction grating 126 reflects few wavelengths of the first plurality of wavelengths back into the first gain chip 102 and allows other wavelengths of the first plurality of wavelengths to pass through the diffraction grating 126 to form a first output beam of the conventional laser module 100. The first gain chip 102 has a front-end 122a and a back-end 122b. The front-end 122a is coated with an anti-reflective material, whereas the back-end 122b is coated with a reflective material. The first wavelengths of the first plurality of wavelengths that are reflected back into the first gain chip 102 are transmitted through the first gain chip 102 by way of the front-end 122a, and reflected back by the back-end 122b of the first gain chip 102.

The first temperature sensor 106 is mounted on the first submount 108. The first external cavity 120 is formed between the first gain chip 102 and the diffraction grating 126. The first submount 108 and the second submount 110 are mounted on the first heatsink 112. The first heatsink 112 is mounted on the first TEC 114. The first case 116 encompasses the first gain chip 102, the first grating element 104, the first temperature sensor 106, the first submount 108, the second submount 110, the first heatsink 112, and the first TEC 114. The first case 116 is mounted on the second heatsink 118.

In the conventional laser module 100, the reflection of the few wavelengths between the diffraction grating 126 and the back-end 122b leads to a formation of a first plurality of longitudinal cavity modes in the first external cavity 120. A spacing between any two longitudinal cavity modes of the first plurality of longitudinal cavity modes is constant and based on a length of the first external cavity 120.

After the first plurality of longitudinal cavity modes are formed in the first external cavity 120, another wavelength that is reflected by the diffraction grating 126 is aligned to a first longitudinal cavity mode of the first plurality of longitudinal cavity modes. The first longitudinal cavity mode has a wavelength that approximately matches the reflected wavelength in comparison to remaining longitudinal cavity modes of the first plurality of longitudinal cavity modes. The reflected wavelength aligned to the first longitudinal cavity mode is emitted from the conventional laser module 100 as the first output beam of the conventional laser module 100. When the reflected wavelength is aligned to the first longitudinal cavity mode, the first longitudinal cavity mode is in an excited state. Further, remaining longitudinal cavity modes of the first plurality of cavity modes remain at an initial state.

The first temperature sensor 106 measures a first temperature of the first gain chip 102. The first TEC 114 controls the first temperature of the conventional laser module 100 based on the first temperature values measured by the first temperature sensor 106. A first controller 130 may be coupled to the conventional laser module 100. The first controller 130 that is external to the conventional laser module 100 receives the first temperature values of the first gain chip 102 from the first temperature sensor 106. Based on the first temperature values, the first controller 130 generates a first control signal CS1 and controls the first TEC 114 by way of the first control signal CS1.

The first TEC 114 tunes the first plurality of wavelengths of the first laser beam by varying the first temperature of the first gain chip 102. In a scenario, while tuning the first plurality of wavelengths of the first laser beam, varying the first temperature of the first gain chip 102 leads to thermal expansion of the first gain chip 102 and the first grating element 104, which may further vary the length of the first external cavity 120. As the length of the first external cavity 120 varies, the first plurality of longitudinal cavity modes including the first longitudinal cavity mode drift, while the reflected wavelength aligned to the first longitudinal cavity mode remains stationary. As a result, the reflected wavelength aligns to a second longitudinal cavity mode (shown later in FIG. 2A), thus resulting in a shift of the wavelength of the first output beam. In another scenario, tuning the first plurality of wavelengths of the first laser beam by varying the first temperature of the first gain chip 102 may vary a refractive index of the diffraction grating 126. When the refractive index of the first grating element 104 varies, the reflected wavelength drifts whereas the first plurality of longitudinal cavity modes remain stationary. As a result, the reflected wavelength aligns to the second longitudinal cavity mode (shown later in FIG. 2B), thereby causing mode-hopping of the first laser beam. The mode-hopping of the first laser beam results in mode-hopping of the first output beam.

Figure 2:
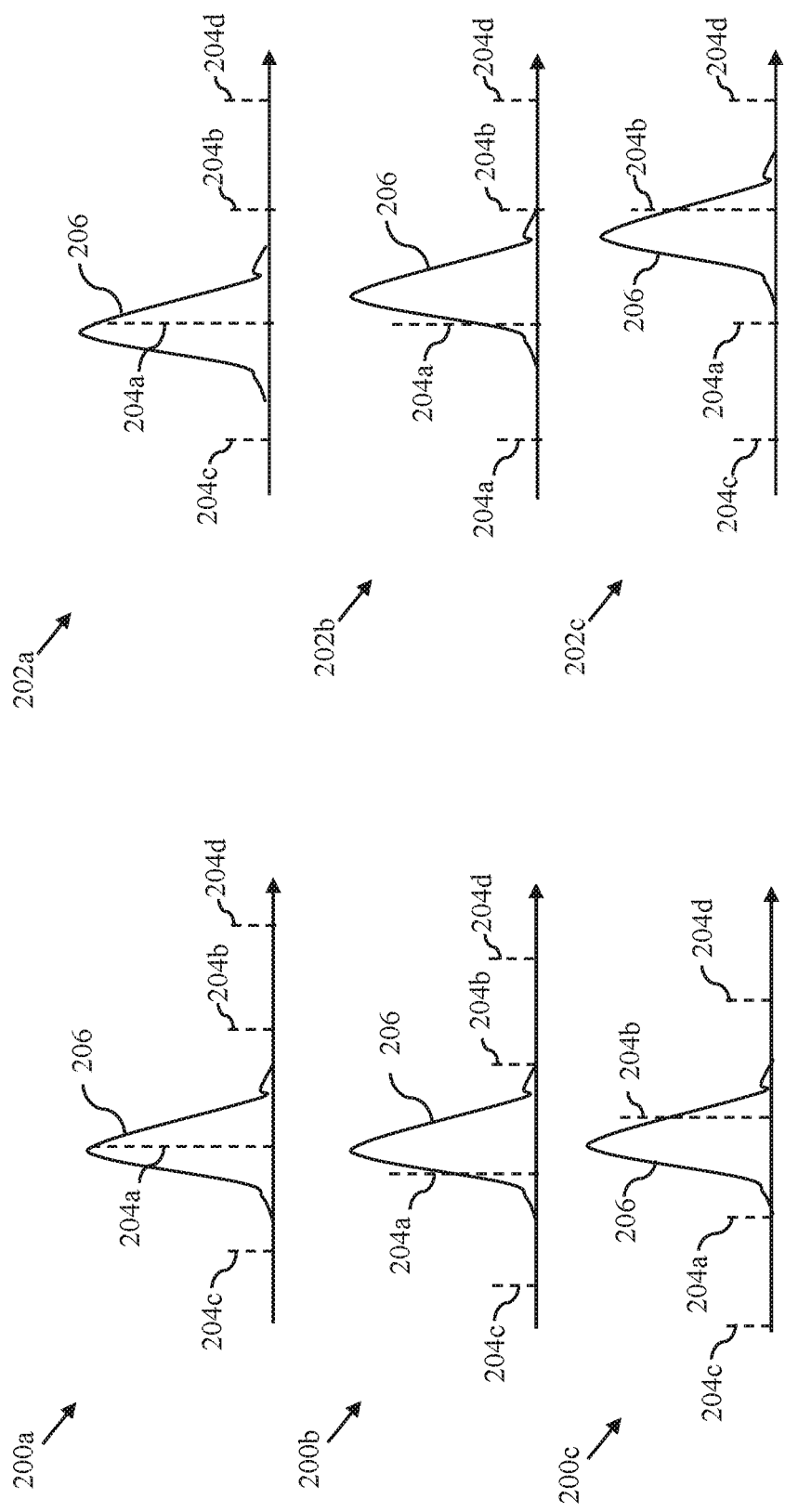
FIGS. 2A and 2B are diagrams that illustrate graphs that depict mode-hopping in the conventional laser module of FIG. 1.

FIGS. 2A and 2B are diagrams that illustrate graphs 200a, 200b, 200c, 202a, 202b, and 202c that depict mode-hopping in the conventional laser module 100. In FIG. 2A, mode-hopping due to drifting of the plurality of the longitudinal cavity modes that include the first longitudinal cavity mode 204a, the second longitudinal cavity mode 204b, a third longitudinal cavity mode 204c, a fourth longitudinal cavity mode 204d, and a wavelength 206 is shown. The wavelength 206 is stationary. Further, the wavelength 206 is the reflected wavelength as described in FIG. 1. X-axis represents wavelengths of the plurality of the longitudinal cavity modes in nanometers and Y-axis represents intensity of the plurality of the longitudinal cavity modes in arbitrary unit. The first longitudinal cavity mode 204a, the second longitudinal cavity mode 204b, the third longitudinal cavity mode 204c, and the fourth longitudinal cavity mode 204d of the plurality of the longitudinal cavity modes are collectively referred to as "longitudinal cavity modes 204a-204d".

In graph 200a, the wavelength 206 is aligned to the first longitudinal cavity mode 204a. Alternatively stated, the first longitudinal cavity mode 204a is aligned to a peak of the wavelength 206. Thus, the first longitudinal cavity mode 204a is excited and has a higher intensity in comparison to intensities of the second longitudinal cavity mode 204b, the third longitudinal cavity mode 204c, and the fourth longitudinal cavity mode 204d.

In graph 200b, the longitudinal cavity modes 204a-204d drift towards the left, whereas the wavelength 206 remains stationary. As a result, the wavelength 206 is partially aligned to the first longitudinal cavity mode 204a and thus, the intensity of the first longitudinal cavity mode 204a of graph 200b is less than the intensity of the first longitudinal cavity mode 204a of graph 200a.

In graph 200c, the longitudinal cavity modes 204a-204d further drift towards the left, whereas the wavelength 206 remains stationary. As a result, the wavelength 206 is now partially aligned to the second longitudinal cavity mode 204b. The intensity of the second longitudinal cavity mode 204b is same as the intensity of the first longitudinal cavity mode 204a as depicted in graph 200b. Graphs 200a, 200b, and 200c depict that the wavelength 206 has hopped from the first longitudinal cavity mode 204a to the second longitudinal cavity mode 204b, thereby resulting in mode-hopping. Thus, the mode-hopping illustrated in FIG. 2A is due to drifting of the longitudinal cavity modes 204a-204d and the wavelength 206 that is stationary.

In FIG. 2B, mode-hopping due to drifting of the wavelength 206 and the longitudinal cavity modes 204a-204d that are stationary is shown. X-axis represents wavelength of the plurality of the longitudinal cavity modes in nanometers and Y-axis represents intensity of the plurality of the longitudinal cavity modes in arbitrary unit.

In graph 202a, the alignment of the wavelength 206 as shown in graph 202a is same as the alignment of the wavelength 206 shown in graph 200a of FIG. 2B.

In graph 202b, the wavelength 206 drifts towards the right, whereas the longitudinal cavity modes 204a-204d remain stationary. As a result, the wavelength 206 is partially aligned to the first longitudinal cavity mode 204a and thus, the intensity of the first longitudinal cavity mode 204a of graph 202b is less than the intensity of the first longitudinal cavity mode 204a of graph 202a.

In graph 202c, the wavelength 206 further drifts towards the right, whereas the longitudinal cavity modes 204a-204d remain stationary. As a result, the wavelength 206 is now partially aligned to the second longitudinal cavity mode 204b. The intensity of the second longitudinal cavity mode 204b is same as the intensity of the first longitudinal cavity mode 204a of graph 202b. Graphs 202a, 202b, and 202c depict that the wavelength 206 has hopped from the first longitudinal cavity mode 204a to the second longitudinal cavity mode 204b, thereby resulting in mode-hopping. Thus, the mode-hopping illustrated in FIG. 2B is due to drifting of the wavelength 206 and the longitudinal cavity modes 204a-204d that are stationary.

The sudden shifts in the wavelength of the first laser beam cause mode-hopping of the first output beam. Mode-hopping is undesirable as it may cause false trigger signals in various applications where the conventional laser module 100 is employed. The currently available solution for this issue is to tune the first plurality of wavelengths in a mode-hop free window. A wavelength tuning range of the conventional laser module 100 is limited to a predefined range of the mode-hop free window for a fixed temperature of the first case 116. Thus, when a temperature of the first case 116 varies, mode-hopping occurs in mode-hop free window as variation in the temperature of the first case 116 results in variation of the first temperature of the first gain chip 102. The temperature of the first case 116 varies as a result of variation in ambient temperature of the conventional laser module 100. Mode-hopping occurs even during the mode-hop free window as the wavelength tuning is done at the first temperature values measured by the first temperature sensor 106 which does not account for changes in the ambient temperature. Thus, there is a requirement of a laser module in which the first plurality of wavelengths are tuned without any mode-hopping when the temperature of the first case 116 varies due to changes in the ambient temperature.

Figure 3:
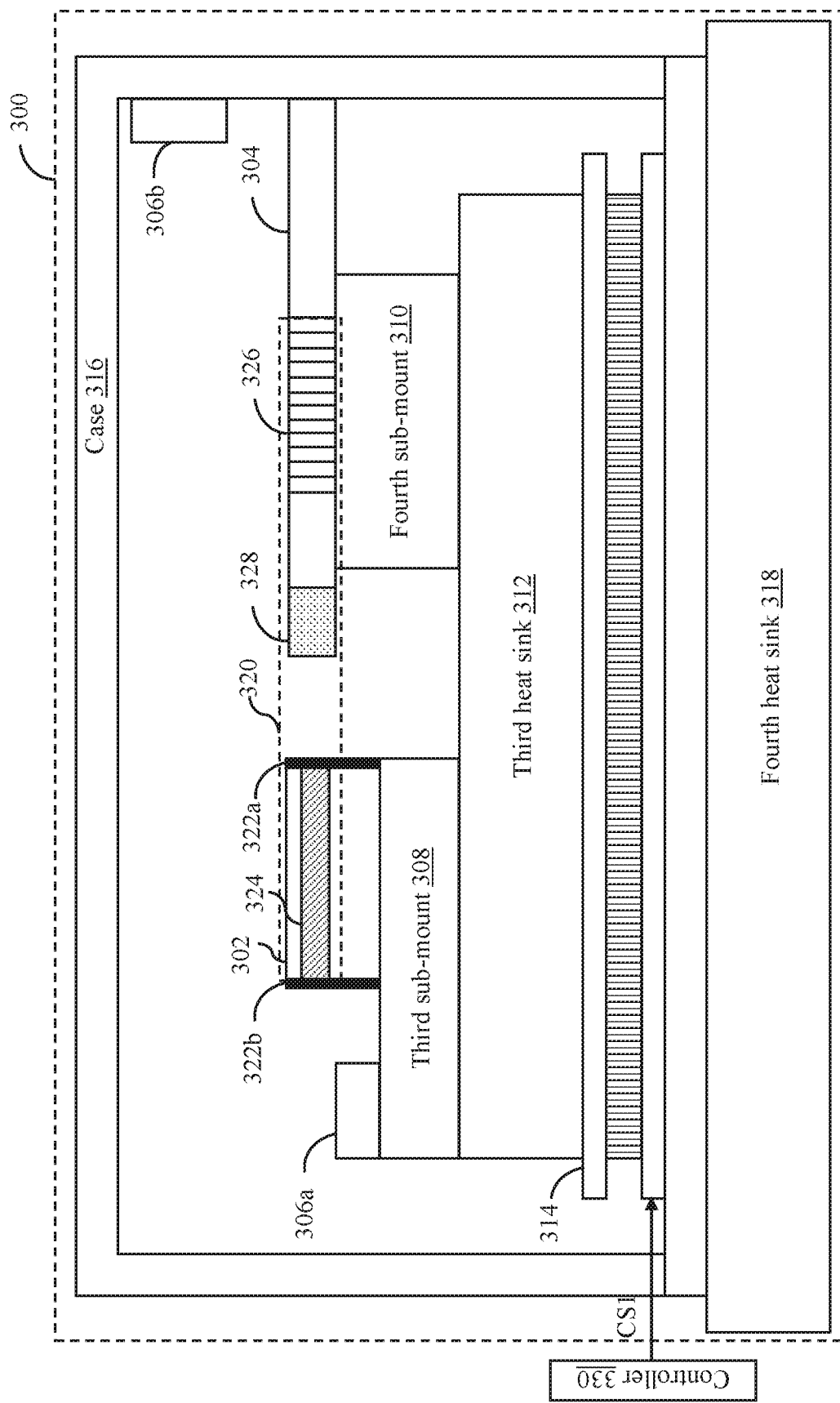
FIG. 3 is a diagram that illustrates a laser module, in accordance with an embodiment of the present disclosure.

FIG. 3 is a diagram that illustrates a laser module 300, in accordance with an embodiment of the present disclosure. The laser module 300 may include a second gain chip 302, a second grating element 304, a second temperature sensor 306a, a third temperature sensor 306b, a third submount 308, a fourth submount 310, a third heatsink 312, a second thermoelectric cooler (TEC) 314, a second case 316, a fourth heatsink 318, and a second external cavity 320. The laser module 300 may be an external cavity laser module.

The second gain chip 302 may be mounted on the third submount 308. The second gain chip 302 includes a gain medium 324 through which the second gain chip 302 may be configured to emit a second laser beam. The second laser beam is emitted at a second plurality of wavelengths. The second gain chip 302 has a front-end 322a and a back-end 322b. The front-end 322a is coated with an anti-reflective material and the back-end 322b is coated with a reflective material.

The second grating element 304 may be mounted on the fourth submount 310 and optically coupled to the second gain chip 302. The second grating element 304 may include a diffraction grating 326. The second grating element 304 may be configured to receive the second laser beam emitted by the second gain chip 302. The second grating element 304 acts as a wavelength discriminator as the diffraction grating 326 reflects first wavelengths of the second plurality of wavelengths back into the second gain chip 302 and allows second wavelengths of the second plurality of wavelengths to pass through the diffraction grating 326 to form a second output beam of the laser module 300. The first wavelengths of the second plurality of wavelengths that are reflected back into the second gain chip 302 are transmitted through the second gain chip 302 via the front-end 322a and reflected by the back-end 322b of the second gain chip 302.

The second grating element 304 may be an optical fiber. One end of the second grating element 304 is a lensed fiber 328 as the lensed fiber 328 facilitates the optical coupling of the second gain chip 302 to the second grating element 304. The lensed fiber 328 has a shape that ensures coupling of the second laser beam into the second grating element 304. The diffraction grating 326 is obtained by periodic variation of a refractive index of the second grating element 304. Due to variation in the refractive index, the diffraction grating 326 reflects the first wavelengths of the second plurality of wavelengths and allows the second wavelengths of the second plurality of wavelengths to pass through the diffraction grating 326 to form the second output beam of the laser module 300.

The second external cavity 320 may be formed between the back-end 322b of the second gain chip 302 and the diffraction grating 326. The second external cavity 320 facilitates the coupling of the second laser beam into the second grating element 304.

The second temperature sensor 306a may be coupled to the second gain chip 302. The second temperature sensor 306a may be mounted on the third submount 308. The second temperature sensor 306a may be configured to measure a second temperature of the second gain chip 302. The third submount 308 is formed from a thermally conductive material. The third submount 308 may be mounted on the third heatsink 312. The third submount 308 further facilitates heat transfer between the second gain chip 302 and the third heatsink 312. Examples of the third submount 308 may include, but are not limited to, aluminum nitride, silicon carbide, and tungsten.

The fourth submount 310 may be mounted on the third heatsink 312. The fourth submount 310 is formed from a non-thermal conducting material to thermally isolate the second grating element 304 from the third heatsink 312. Examples of the fourth submount 310 may include, but are not limited to, epoxy and kovar.

The third heatsink 312 may be mounted on the second TEC 314. The third heatsink 312 may be configured to transfer heat between the third submount 308 and the second TEC 314. The second TEC 314 controls a temperature of the laser module 300. A second controller 330 that is external to the laser module 300 may be coupled to the second temperature sensor 306a. The second controller 330 is configured to receive the second temperature measured by the second temperature sensor 306a (not shown).

The second case 316 may be configured to encompass the second gain chip 302, the second grating element 304, the second temperature sensor 306a, the third submount 308, the fourth submount 310, the third heatsink 312, and the second TEC 314. The third temperature sensor 306b may be adhered to an interior surface of the second case 316. The third temperature sensor 306b may be configured to measure a third temperature of the second case 316. The third temperature sensor 306b may be adhered to the second case 316 using a thermally conductive epoxy or a thermally conductive adhesive to measure the third temperature of the second case 316. The second controller 330 may be further configured to receive the third temperature from the third temperature sensor 306b (not shown). The second controller 330 may be a temperature to voltage converter. The second controller 330 controls an operation of the second TEC 314 based on the second temperature and the third temperature. The second TEC 314 may increase or decrease the temperature of the laser module 300 based on a second control signal CS2 received from the second controller 330. The second control signal CS2 may be a voltage signal or a current signal generated by the second controller 330 based on a conversion of the second and third temperatures to voltage or current. The second case 316 may be mounted on the fourth heatsink 318. The fourth heatsink 318 may be configured to transfer heat from the second case 316 to an ambient environment of the laser module 300. Examples of the second temperature sensor 306a and the third temperature sensor 306b may include, but are not limited to, an infrared thermometer, a resistance thermometer, a thermistor, and a thermocouple. The second case 316 may be formed from a thermally conductive material. Examples of the second case 316 may include, but are not limited to, aluminum nitride, silicon carbide, and tungsten.

When a first wavelength of the first wavelengths is reflected by the diffraction grating 326, the first wavelength may superimpose with a second wavelength of the second plurality of wavelengths of the second laser beam that is emitted by the second gain chip 302. If the superposition of the first wavelength on the second wavelength leads to constructive interference, the superposition results in a formation of a longitudinal cavity mode. On the other hand, if the superposition of the first wavelength on the second wavelength leads to destructive interference, the superposition results in suppression of the second wavelength and the third wavelength. The longitudinal cavity mode refers to standing waves that are formed as a result of constructive interference of two waves moving in opposite directions. A longitudinal cavity mode is said to be in an excited state when an intensity of the longitudinal cavity mode is greater than the intensities of the plurality of the longitudinal cavity modes. In the laser module 300, the reflection of the first wavelengths between the diffraction grating 326 and the back-end 322b leads to a formation of a second plurality of longitudinal cavity modes in the second external cavity 320.

The laser module 300 is calibrated to attain a second set of values of the second temperature by tuning the second plurality of wavelengths of the second laser beam through a third plurality of values of the second temperature at a first set of values of the third temperature. The second set of values of the second temperature is hereinafter referred to as "second temperature values". The first set of values of the third temperature is hereinafter referred to as "third temperature values". The third plurality of values of the second temperature are hereinafter referred to as "fourth temperature values". When the second TEC 314 tunes the second plurality of wavelengths of the second laser beam through the second temperature values, the second laser beam emitted from the second gain chip 302 during the tuning of the second plurality of wavelengths of the second laser beam is mode-hop free. Thus, the second output beam emitted from the laser module 300 during the tuning of the second plurality of wavelengths of the second laser beam is mode-hop free. The laser module 300 may be calibrated in a controlled temperature environment as explained in FIG. 4.

Figure 4:
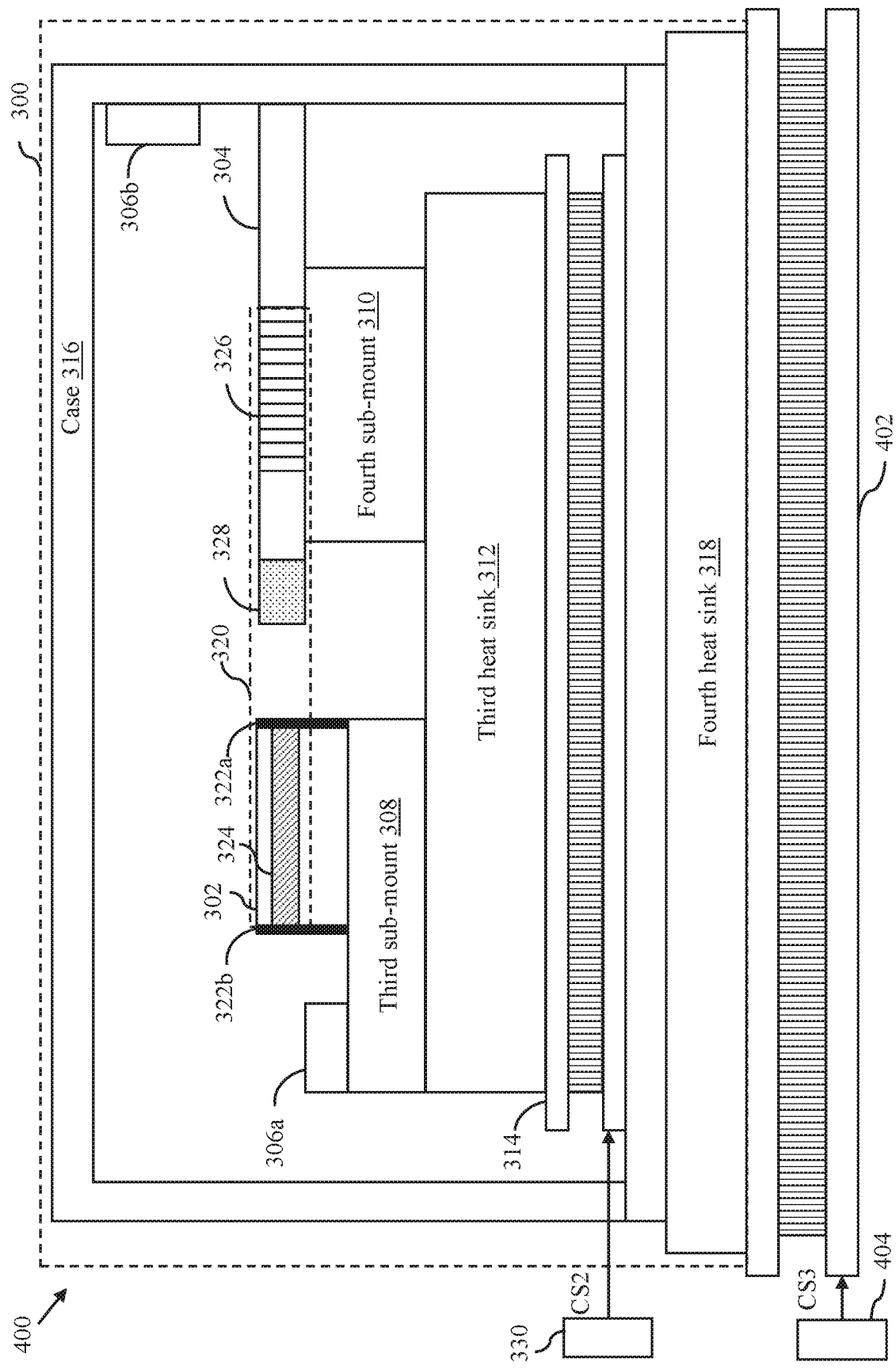
FIG. 4 is a diagram that illustrates a calibration of the laser module of FIG. 3, in accordance with an embodiment of the present disclosure.

FIG. 4 is a diagram 400 that illustrates a calibration of the laser module 300, in accordance with an embodiment of the present disclosure. The second controller 330, an external TEC 402, and a third controller 404 are utilized for the calibration of the laser module 300. The laser module 300 is placed on the external TEC 402 for the calibration of the laser module 300.

The external TEC 402 and the third controller 404 control the temperature of the laser module 300. The third controller 404 may be coupled to the external TEC 402. The third controller 404 may be configured to facilitate controlling the temperature of the laser module 300. The external TEC 402 sets the temperature of the laser module 300 based on a third control signal CS3 received from the third controller 404. The third control signal CS3 may be a voltage signal or a current signal that indicates the temperature to be maintained by the external TEC 402. The third temperature values are based on the temperature of the laser module 300. For calibrating the laser module 300, the second TEC 314 tunes the second plurality of wavelengths of the second laser beam by varying the second temperature of the second gain chip 302. The second temperature is varied through the fourth temperature values for the third temperature values to generate the second temperature values. The second temperature is varied through the fourth temperature values by the second TEC 314 based on the second control signal CS2 received from the second controller 330. The third temperature is varied by the external TEC 402 based on the third control signal CS3 received from the third controller 404. The calibration of the laser module 300 is further explained with an example in conjunction with FIG. 6. The calibration of the laser module 300 provides a linear relationship between the third temperature values and the second temperature values. After the calibration of the laser module 300, a set of values of the second plurality of wavelengths of the second laser beam at which the second plurality of wavelengths of the second laser beam are tuned are stored in a memory (not shown). The third temperature values and the second temperature values are further stored in the memory.

Figure 5:
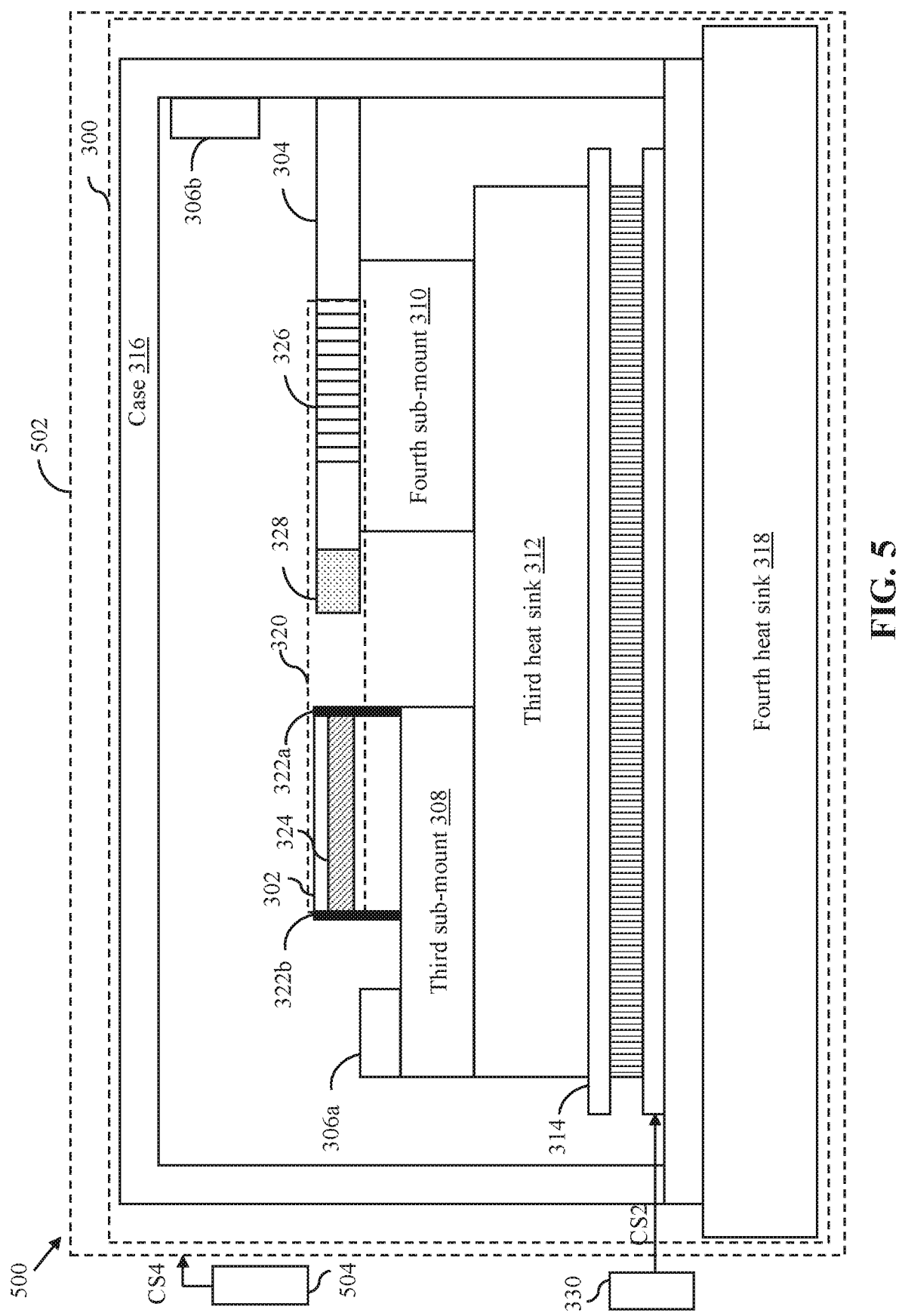
FIG. 5 is a diagram that illustrates the calibration of the laser module of FIG. 3, in accordance with another embodiment of the present disclosure.

FIG. 5 is a diagram 500 that illustrates the calibration of the laser module 300, in accordance with another embodiment of the present disclosure. The second controller 330, a thermal chamber 502, and a fourth controller 504 are utilized for the calibration of the laser module 300. The laser module 300 is placed in the thermal chamber 502 for the calibration of the laser module 300.

The thermal chamber 502 and the fourth controller 504 control the temperature of the laser module 300 in a similar manner as the external TEC 402 and the third controller 404, respectively. The fourth controller 504 generates a fourth control signal CS4 to control a temperature of the thermal chamber 502. The calibration of the laser module 300 of FIG. 5 is similar to the calibration of the laser module 300 as described in FIG. 4.

Figure 6:
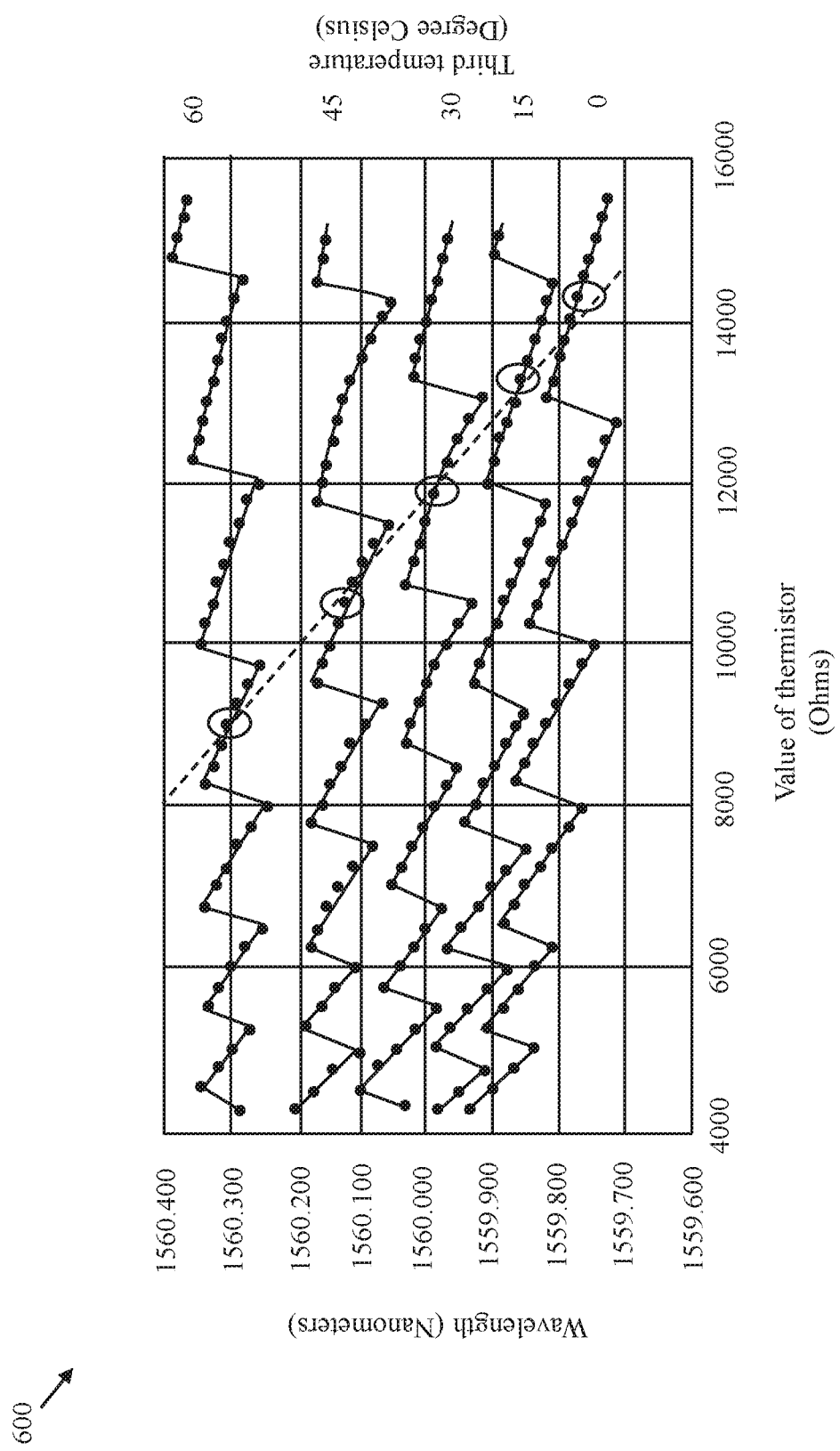
FIG. 6 is a graph that illustrates a wavelength tuning map of the laser module during the calibration of the laser module of FIG. 3, in accordance with an embodiment of the present disclosure.

FIG. 6 is a graph that illustrates a wavelength tuning map 600 of the laser module 300 during the calibration of the laser module 300, in accordance with an embodiment of the present disclosure. The wavelength tuning map 600 is a plot of tuning the second laser beam to a first wavelength, a second wavelength, a third wavelength, a fourth wavelength, and a fifth wavelength of the second plurality of wavelengths by varying the second temperature at the third temperature values. In an example, the second temperature sensor 306a is a thermistor. X-axis of the wavelength tuning map 600 represents value of the thermistor in Ohms. Y-axis on the left of the wavelength tuning map 600 represents a few wavelengths of the first plurality of wavelengths in nanometers. Y-axis on the right of the wavelength tuning map 600 represents the third temperature values in degree Celsius. The thermistor value is varied by varying the second temperature through the fourth temperature values.

In an example, the second plurality of wavelengths of the second laser beam is tuned from 1559.900 nanometers (nm) to 1559.700 nm by varying the second temperature that results in variation of the thermistance of the thermistor from 4000 ohms to 16000 ohms when the third temperature is 0 degree Celsius. The wavelength tuning map 600 shows that the second plurality of wavelengths of the second laser beam while it is tuned from 1559.900 nm to 1559.700 nm is in a sawtooth pattern that indicates mode-hopping. Similarly, the second plurality of wavelengths of the second laser beam are tuned to the first wavelength, the second wavelength, the third wavelength, the fourth wavelength, and the fifth wavelength of the second plurality of wavelengths by varying the second temperature at fourth temperature values for the third temperature values. In the wavelength tuning map 600, the third temperature values include 0 degree Celsius, 15 degrees Celsius, 30 degrees Celsius, 45 degrees Celsius, and 60 degrees Celsius.

The second temperature values include a first value. The third temperature values include a second value. Further, the fourth temperature values include a third value and a fourth value that corresponds to a fifth value and a sixth value of the thermistance. The first value for tuning the second plurality of wavelengths of the second laser beam to the first wavelength of the second plurality of wavelengths at the second value is selected such that the first value is a mean of the third value and the fourth value and the first wavelength is mode-hop free between the third value and the fourth value. In an example, the first value is 1559.780 nm, the second value is 0 degree Celsius, the fifth value is 13000 ohms, and the sixth value is 15500 ohms in the wavelength tuning map 600. The first value is considered as a first stable operating point as mode-hopping does not occur at the first value. Similarly, a second stable operating point, a third stable operating point, a fourth stable operating point, and a fifth stable operating point are obtained for tuning the second laser beam to the second wavelength, the third wavelength, the fourth wavelength, and the fifth wavelength, respectively. Connecting the first stable operating point, the second stable operating point, the third stable operating point, the fourth stable operating point, and the fifth stable operating point results in a linear graph between the second temperature values and the third temperature values. X-axis of the linear graph denotes the third temperature values and the Y-axis of the linear graph denotes the second temperature values. Thus, a linear relationship between the first value and the second value is given by equation (1) as shown below:

$$T1 = A*T2 + B \quad (1)$$

where,

T1 is the first value,

T2 is the second value,

A is a gradient of the linear graph, and

B is an intercept of the Y-axis of the linear graph.

When the second plurality of wavelengths of the second laser beam is tuned at the second temperature values, a wavelength of the second laser beam emitted by the second gain chip 302 is mode-hop free. The wavelength of the second laser beam is mode-hop free as a consequence of thermal compensation of changes in an ambient temperature of the laser module 300. In such a scenario, any changes in the ambient temperature are determined by the third temperature sensor 306b. Further, the second TEC 314 tunes the second plurality of wavelengths of the second laser beam using the second temperature values. The second temperature values ensure an operation of the laser module 300 such that the laser module 300 is mode-hop free.

Figure 7:
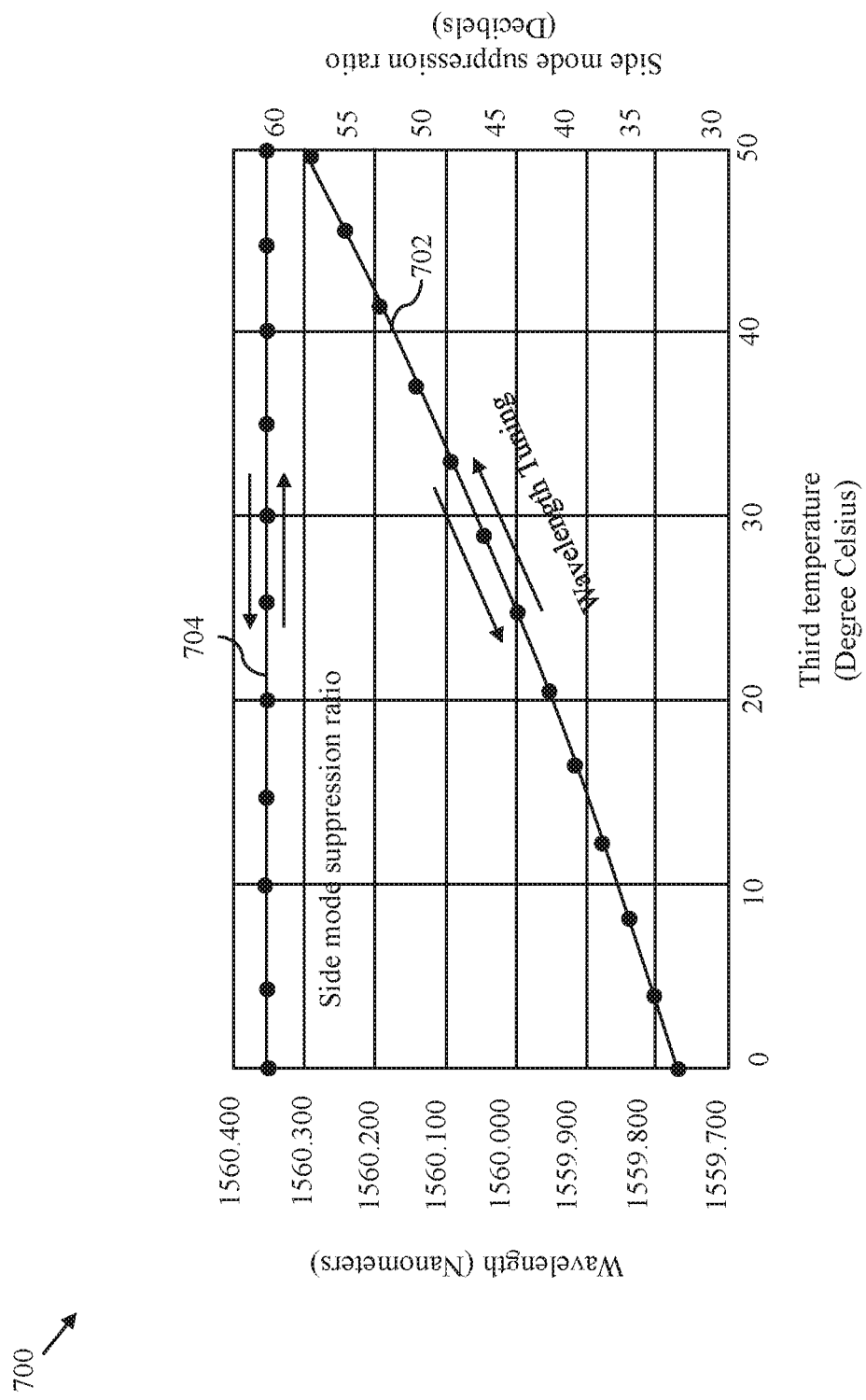
FIG. 7 is a graph that illustrates a wavelength tuning map and a side mode suppression ratio of the laser module after the calibration of the laser module of FIG. 3, in accordance with an embodiment of the present disclosure.

FIG. 7 is a graph 700 that illustrates a wavelength tuning map 702 and a side mode suppression ratio 704 of the laser module 300, in accordance with an embodiment of the present disclosure. X-axis represents the third temperature values in degree Celsius. The Y-axis on the left of the graph 700 represents the second plurality of wavelengths of the second laser beam in nanometers and Y-axis on the right of the graph 700 represents the side mode suppression ratio of the laser module 300 in decibels. The wavelength tuning map 702 shown in FIG. 7 is for the wavelength tuning done after the calibration of the laser module 300.

The wavelength tuning map 702 illustrates that when a wavelength of the second laser beam is tuned from 1559.780 nm to 1560.300 nm and from 1560.300 to 1559.780 nm for varying third temperature values from 0 degree Celsius to 50 degrees Celsius, there is no mode-hopping. Thus, the variation in the ambient temperature of the laser module 300 that further leads to a variation in the third temperature of the second case 316 does not result in any mode-hopping during the wavelength tuning in the laser module 300.

The wavelength tuning map 702 thereby illustrates that when the wavelength of the second laser beam is tuned at the second temperature values, the wavelength of the second laser beam is mode-hop free. After the calibration of the laser module 300, when the second plurality of wavelengths of the second laser beam are tuned, the second plurality of the longitudinal cavity modes and a reflected wavelength of the first wavelengths that is aligned to one of the second plurality of the longitudinal cavity modes, drift in a same direction at a same speed. Thus, the wavelength tuning map 702 does not illustrate any mode-hopping in the second laser beam. The second plurality of the longitudinal cavity modes and a reflected wavelength of the first wavelengths drift at a same speed and in a same direction because of the thermal compensation during the tuning of the second plurality of wavelengths. A wavelength tuning range of the second gain chip 302 of the laser module 300 is in a range of 0.03-0.5 nanometers.

The side mode suppression ratio 704 illustrates that there is no fluctuation in the side mode suppression ratio 704 during the tuning of the wavelength of the second laser beam from 1559.780 nm to 1560.300 nm and from 1560.300 to 1559.780 nm. Thus, the side mode suppression ratio 704 indicates that the second laser beam has a single wavelength mode. Multiple reflections of the second laser beam between the second grating element 304 and the back-end 322b of the second gain chip 302 results in emission of a third laser beam from the second gain chip 302 at the first wavelengths of the second plurality of wavelengths. Further, tuning of the first wavelengths of the third laser beam to a desired wavelength results in emission of the second output beam having the single wavelength mode from the second gain chip 302.

Figure 8:
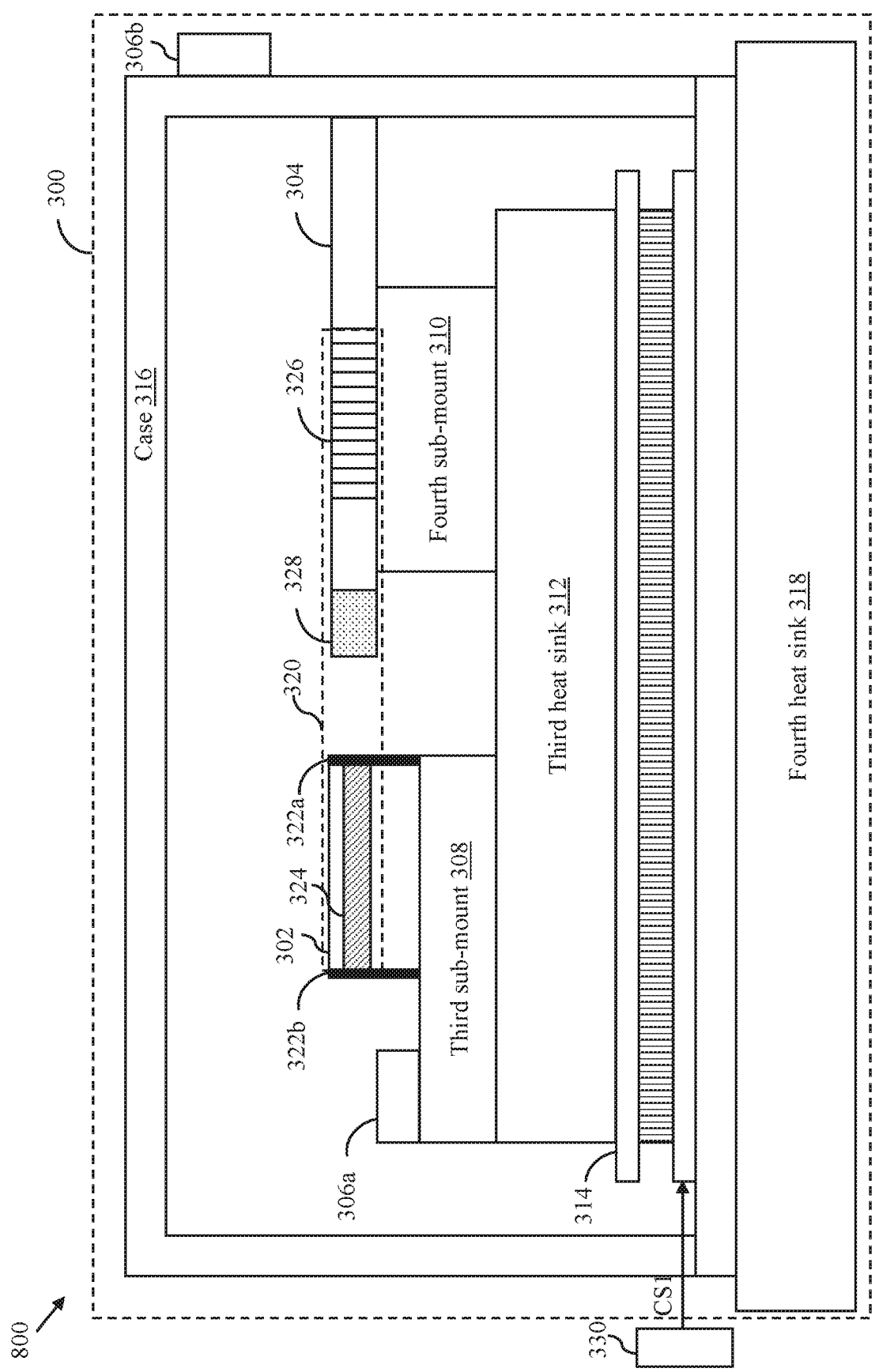
FIG. 8 is a diagram that illustrates the laser module of FIG. 3, in accordance with another embodiment of the present disclosure.

FIG. 8 is a diagram 800 that illustrates the laser module 300, in accordance with another embodiment of the present disclosure. The second controller 330 is coupled to the laser module 300. In FIG. 8, the third temperature sensor 306b adheres to an exterior surface of the second case 316. The functioning of the third temperature sensor 306b, the laser module 300, and the second controller 330 of FIG. 8 is similar to the functioning of the third temperature sensor 306b, the laser module 300, and the second controller 330, respectively, of FIG. 3.

Figure 9:
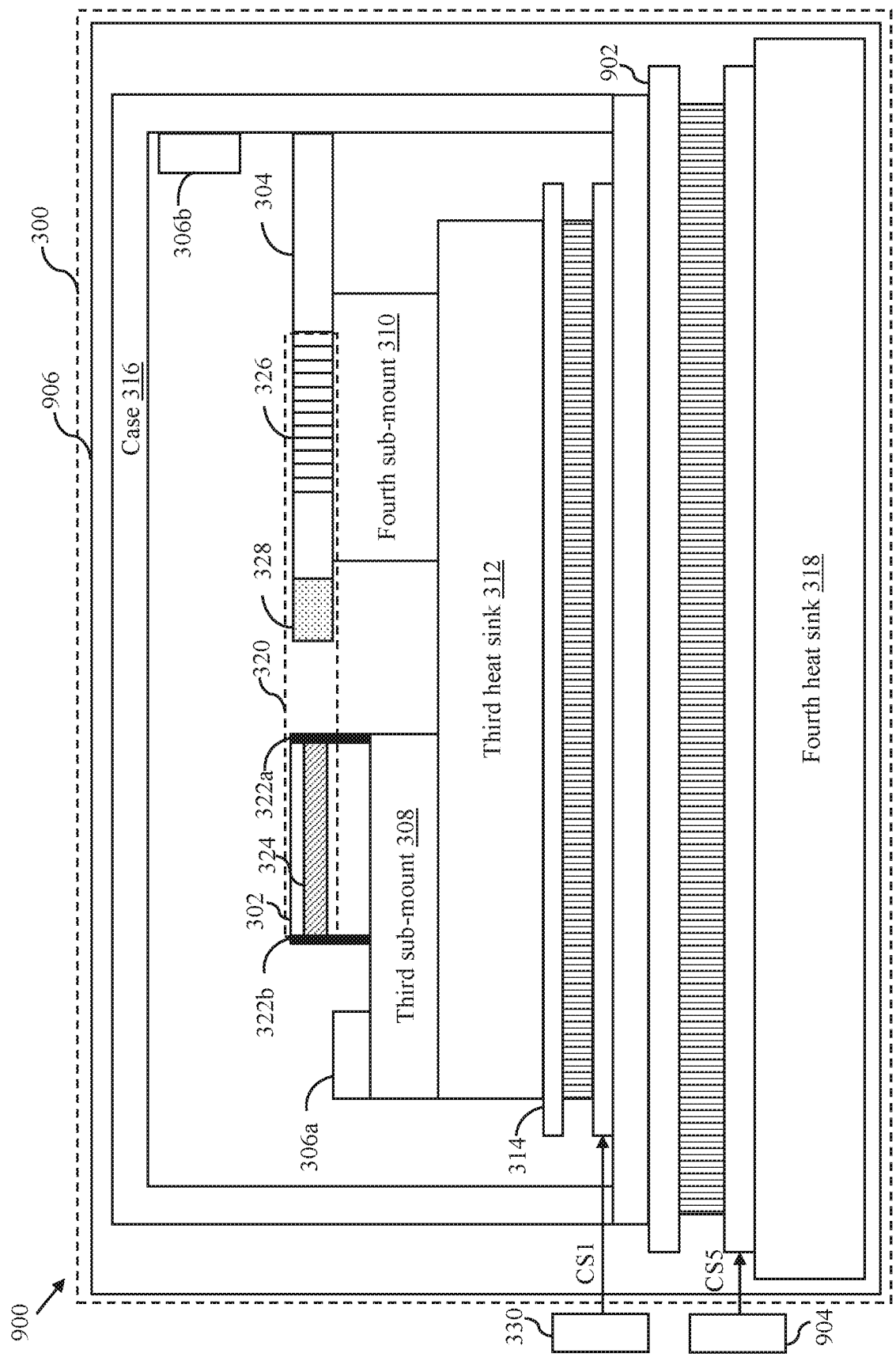
FIG. 9 is a diagram that illustrates the laser module of FIG. 3, in accordance with yet another embodiment of the present disclosure.

FIG. 9 is a diagram 900 that illustrates the laser module 300, in accordance with yet another embodiment of the present disclosure. The second controller 330 is coupled to the laser module 300. A third TEC 902 is controlled by a fifth controller 904 that are external to the laser module 300 of FIG. 9. The laser module 300 of FIG. 9 further includes a thermal resistance material 906 that may encompass the second case 316, the fourth heatsink 318, and the third TEC 902. The third TEC 902 may be sandwiched between the second case 316 and the fourth heatsink 318. The third TEC 902 may facilitate the wavelength tuning of the second gain chip 302. The third TEC 902 may be configured to control the third temperature of the second case 316 to tune the second plurality of wavelengths of the second laser beam to a desired wavelength of the second plurality of wavelengths based on the linear relationship between the third temperature values and the second temperature values. The fifth controller 904 is external to the laser module 300 and may be coupled to the third temperature sensor 306b. The fifth controller 904 receives the third temperature of the second case 316 (not shown) and further controls the third TEC 902 by a fifth control signal CS5 to set the third temperature of the second case 316. The fifth control signal CS5 is similar to the second control signal CS2. The third temperature sensor 306b may be adhered to an exterior surface of the second case 316 in the laser module 300 of FIG. 9.

The thermal resistance material 906 may be configured to isolate the laser module 300 from the ambient environment of the laser module 300 to prevent thermal leakage from the laser module 300 to the ambient environment. By preventing the thermal leakage from the laser module 300, controlling the temperature of the laser module 300 of FIG. 9 is further improved in comparison to controlling the temperature of the laser module 300 of FIG. 3.

Examples of the second controller 330, the third controller 404, the fourth controller 504, and the fifth controller 904 include, but are not limited to, an application-specific integrated circuit (ASIC) processor, a reduced instruction set computing (RISC) processor, a complex instruction set computing (CISC) processor, a field-programmable gate array (FPGA), and the like.

Figure 10:
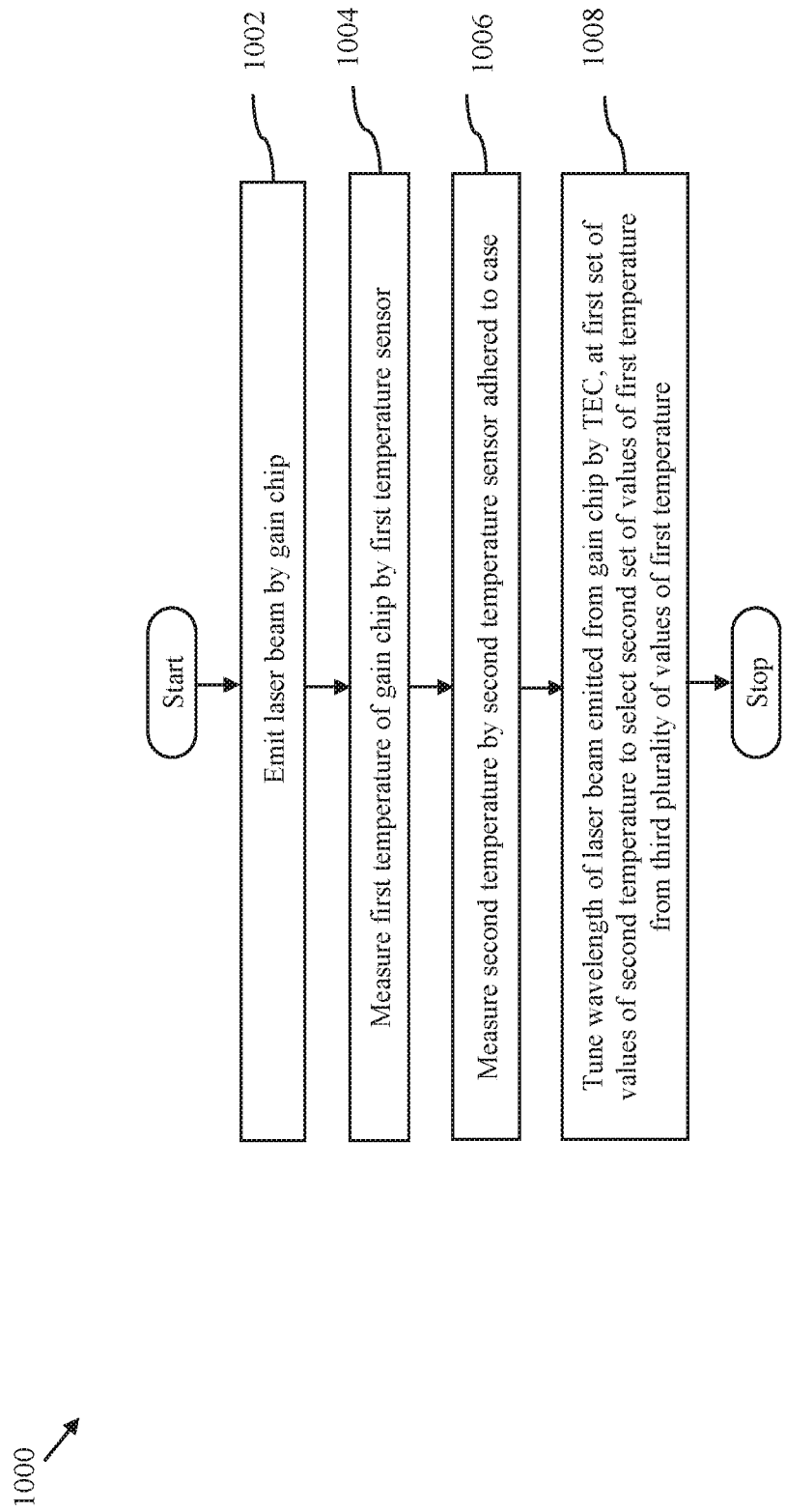
FIG. 10 is a flowchart that illustrates a method of tuning wavelengths of the laser module of FIG. 3, in accordance with an embodiment of the present disclosure.

FIG. 10 is a flowchart that illustrates a method of tuning wavelengths of the laser module 300, in accordance with an embodiment of the present disclosure. At 1002, the second gain chip 302 emits the second laser beam. At 1004, the second temperature sensor 306a measures the second temperature of the second gain chip 302. At 1006, the third temperature sensor 306b adheres to the second case 316 that encompasses the second gain chip 302 and the second temperature sensor 306a. Further, the third temperature sensor 306b measures the third temperature of the second case 316. At 1008, the second TEC 314 tunes the second plurality of wavelengths of the second laser beam emitted from the second gain chip 302 at third temperature values to select the second temperature values from the fourth temperature values, such that the second plurality of wavelengths emitted at the second temperature values are mode-hop free.

As the second laser beam of the laser module 300 is being tuned at third temperature values, the second laser beam emitted during the tuning is mode-hop free. As a result of the linear relationship between the second temperature values and the third temperature values, any changes in the ambient temperature of the laser module 300 is compensated by controlling the temperature of the laser module 300 by the second TEC 314 based on the second temperature values and the third temperature values.

The laser module 300 offers a mode-hop free wavelength tuning range which is ten times wider in comparison to the mode-hop free wavelength tuning range of the conventional laser module 100. The wider wavelength tuning range provides a wider working range for the laser module 300 that is sufficient to tune the wavelength of the second laser beam to a desired wavelength. The laser module 300 tunes the wavelength of the second laser beam without causing any false trigger signals when the laser module 300 is used in various applications. The laser module 300 emits the second output beam with a single wavelength mode without any fluctuations in the side mode suppression ratio during the wavelength tuning of the second laser beam in comparison to the conventional laser module 100 that exhibits a saw-tooth pattern of side mode suppression ratio during the wavelength tuning of the first laser beam. The laser module 300 may be utilized as an enabling component for sensing applications such as optical metrology, interferometric sensing, and spectroscopy of trace gas detection.

Coupling as mentioned in this disclosure refers to an optical coupling, a mechanical coupling, an electrical coupling, an electromagnetic coupling, or a combination thereof.

The applicability of the present disclosure is not limited to the laser module 300 as described in FIGS. 3-9 and 10, and is extendable to include various other types of light emitting devices including light emitting diodes, superluminescent light emitting diodes, organic light emitting devices, or the like.

In the claims, the words 'comprising', 'including', and 'having' do not exclude the presence of other elements or steps than those listed in a claim. The terms "a" or "an," as used herein, are defined as one or more than one. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

While various exemplary embodiments of the disclosed system and method have been described above it should be understood that they have been presented for purposes of example only, not limitations. It is not exhaustive and does not limit the disclosure to the precise form disclosed. Numerous modifications, changes, variations, substitutions, and equivalents will be apparent to those skilled in the art, without departing from the spirit and scope of the present disclosure, as described.

The invention claimed is:

1. An external cavity laser module, comprising:
 a gain chip configured to emit a laser beam, wherein
  the gain chip has a front-end and a back-end,
  the front-end is coated with an anti-reflective material, and
  the back-end is coated with a reflective material;
 a first temperature sensor coupled to the gain chip, wherein the first temperature sensor is configured to measure a temperature of the gain chip;
 a case that encompasses the gain chip and the first temperature sensor;
 a second temperature sensor adhered to the case, wherein the second temperature sensor is configured to measure a temperature of the case;
 a first submount that is formed of a thermally conductive material, wherein the gain chip is mounted on the first submount;
 a grating element optically coupled to the gain chip, wherein
  the grating element is configured to receive the laser beam from the gain chip,
  the grating element comprises a diffraction grating, and
  the diffraction grating reflects first wavelengths of a plurality of wavelengths of the laser beam into the gain chip and transmits second wavelengths of the plurality of wavelengths of the laser beam to emit an output beam from the external cavity laser module;
 an external cavity formed between the gain chip and the diffraction grating, wherein the external cavity facilitates optical coupling of the gain chip to the grating element;
 a first thermoelectric cooler (TEC) coupled to the first temperature sensor and the second temperature sensor, wherein
  the first TEC is configured to:
   vary, based on a first temperature value, the temperature of the gain chip when the temperature of the case is a second temperature value, wherein the first temperature value is a mean of two temperature values, of a plurality of temperature values, corresponding to thermistor resistance values of the first temperature sensor; and
   tune, based on the variation of the temperature of the gain chip, the plurality of wavelengths of the laser beam,
  the emission of the laser beam from the gain chip is based on the tuned plurality of wavelengths of the laser beam, and
  the laser beam emitted from the gain chip is mode-hop free within the two temperature values of the plurality of temperature values;
 a first heatsink mounted on the first TEC, wherein
  the first submount is mounted on the first heatsink, and
  the first heatsink is configured to transfer heat between the first submount and the first TEC; and
 a second submount mounted on the first heatsink, wherein
  the grating element is mounted on the second submount, and
  the second submount thermally isolates the grating element from the first heatsink.

2. The external cavity laser module of claim 1, wherein
 the external cavity laser module is placed on an external TEC such that a temperature of the external cavity laser module is controlled by the external TEC, and
 the external TEC is controlled by a controller that is external to the external cavity laser module.

3. The external cavity laser module of claim 1, wherein
 the external cavity laser module is placed in a thermal chamber such that a temperature of the external cavity laser module is controlled by the thermal chamber, and
 the thermal chamber is controlled by a controller that is external to the external cavity laser module.

4. The external cavity laser module of claim 1, wherein the tuning of the plurality of wavelengths of the laser beam emitted from the gain chip is controlled by a controller that is external to the external cavity laser module.

5. The external cavity laser module of claim 1, wherein the second temperature sensor is adhered to the case using at least one of a thermally conductive adhesive or a thermally conductive epoxy.

6. The external cavity laser module of claim 1, wherein the second temperature sensor is adhered to at least one of an interior surface of the case or an exterior surface of the case.

7. The external cavity laser module of claim 1, wherein a wavelength tuning range of the gain chip is in a range of 0.03-0.5 nanometers.

8. The external cavity laser module of claim 1, wherein a first end of the grating element is a lensed fiber for coupling the laser beam emitted from the gain chip into the grating element.

9. The external cavity laser module of claim 1, wherein the output beam emitted from the external cavity laser module has a single wavelength mode.

10. The external cavity laser module of claim 1, wherein the case further encompasses the first TEC, the first heatsink, the first submount, the second submount, the grating element, and the external cavity.

11. The external cavity laser module of claim 1, further comprising a second heatsink, wherein the case is mounted on the second heatsink.

12. The external cavity laser module of claim 11, further comprising a second TEC sandwiched between the case and the second heatsink, wherein
the second TEC facilitates a wavelength tuning of the gain chip, and
the second TEC is controlled by a controller that is external to the external cavity laser module for facilitating the wavelength tuning of the gain chip.

13. The external cavity laser module of claim 12, further comprising a thermal resistance material, wherein the thermal resistance material encompasses the case, the second TEC, and the second heatsink to prevent thermal leakage from the external cavity laser module to an ambient environment.

14. A method of tuning wavelengths of an external cavity laser module, the method comprising:
emitting a laser beam by a gain chip of the external cavity laser module, wherein
the gain chip has a front-end and a back-end,
the front-end is coated with an anti-reflective material,
the back-end is coated with a reflective material,
the external cavity laser module comprises:
the gain chip;
a first temperature sensor coupled to the gain chip;
a case that encompasses the gain chip and the first temperature sensor;
a second temperature sensor adhered to the case;
a first submount that is formed of a thermally conductive material wherein the gain chip is mounted on the first submount;
a grating element optically coupled to the gain chip, wherein
the grating element is configured to receive the laser beam from the gain chip,
the grating element comprises a diffraction grating, and
the diffraction grating reflects first wavelengths of a plurality of wavelengths of the laser beam into the gain chip and transmits second wavelengths of the plurality of wavelengths of the laser beam to emit an output beam from the external cavity laser module;
an external cavity formed between the gain chip and the diffraction grating, wherein the external cavity facilitates optical coupling of the gain chip to the grating element:
a thermoelectric cooler (TEC) coupled to the first temperature sensor and the second temperature sensor:
a heatsink mounted on the TEC, wherein
the first submount is mounted on the heatsink, and
the heatsink is configured to transfer heat between the first submount and the TEC; and
a second submount mounted on the heatsink, wherein
the grating element is mounted on the second submount, and
the second submount thermally isolates the grating element from the heatsink;
measuring a temperature of the gain chip by the first temperature sensor;
measuring a temperature of the case by the second temperature sensor;
varying, by the TEC based on a first temperature value, the temperature of the gain chip when the temperature of the case is a second temperature value, wherein the first temperature value is a mean of two temperature values, of a plurality of temperature values, corresponding to thermistor resistance values of the first temperature sensor; and
tuning, by the TEC, the plurality of wavelengths of the laser beam based on the variation of the temperature of the gain chip, wherein
the emission of the laser beam from the gain chip is based on the tunned plurality of wavelengths of the laser beam, and
the laser beam emitted from the gain chip is mode-hop free within the two temperature values of the plurality of temperature values.

* * * * *